US009000787B2

(12) United States Patent
Inman et al.

(10) Patent No.: US 9,000,787 B2
(45) Date of Patent: Apr. 7, 2015

(54) METHOD AND SYSTEM FOR LOW-POWER THREE-PHASE DETECTION

(75) Inventors: Brian Inman, Syracuse, NY (US); Robert P. Dolan, Ogdensburg, NY (US); Anthony G. Russo, Syracuse, NY (US); Steven M. Palermo, Rochester, NY (US)

(73) Assignee: Carrier Corporation, Farmington, CT (US)

( * ) Notice: Subject to any disclaimer, the term of this patent is extended or adjusted under 35 U.S.C. 154(b) by 1204 days.

(21) Appl. No.: 12/674,766

(22) PCT Filed: Dec. 21, 2007

(86) PCT No.: PCT/US2007/088491
§ 371 (c)(1),
(2), (4) Date: Feb. 23, 2010

(87) PCT Pub. No.: WO2009/082395
PCT Pub. Date: Jul. 2, 2009

(65) Prior Publication Data
US 2011/0204907 A1    Aug. 25, 2011

(51) Int. Cl.
*G01R 31/02*    (2006.01)
*G01R 29/18*    (2006.01)

(52) U.S. Cl.
CPC ..................................... *G01R 29/18* (2013.01)

(58) Field of Classification Search
USPC ............... 324/683, 709, 521, 750.01
See application file for complete search history.

(56) References Cited

U.S. PATENT DOCUMENTS

| | | | | |
|---|---|---|---|---|
| 4,553,018 A * | 11/1985 | Kondo et al. | ............ | 219/130.51 |
| 5,107,469 A * | 4/1992 | Dodson | ......................... | 368/109 |
| 5,184,063 A * | 2/1993 | Eisenhauer | ..................... | 324/86 |
| 5,378,979 A * | 1/1995 | Lombardi | ..................... | 324/107 |
| 5,525,921 A * | 6/1996 | Callahan | ....................... | 327/144 |
| 5,652,505 A * | 7/1997 | Brune | ............................ | 324/107 |
| 5,828,309 A * | 10/1998 | Kumakura et al. | ........... | 340/658 |
| 6,614,217 B2 * | 9/2003 | Oohashi | ....................... | 324/107 |
| 6,777,954 B2 * | 8/2004 | Yamada et al. | ................ | 324/543 |
| 6,839,277 B2 * | 1/2005 | Nguyen et al. | ............ | 365/185.04 |
| 7,710,121 B2 * | 5/2010 | Harvey et al. | ................. | 324/503 |
| 2007/0001680 A1 * | 1/2007 | Khoo | ............................ | 324/430 |

OTHER PUBLICATIONS

International Preliminary Report on Patentability for PCT/US2007/088491 mailed on Jul. 1, 2010.
Search Report and Written Opinion mailed on May 23, 2008 for PCT/US2007/08849.

* cited by examiner

*Primary Examiner* — Huy Q Phan
*Assistant Examiner* — Adam Clarke
(74) *Attorney, Agent, or Firm* — Carlson, Gaskey & Olds, P.C.

(57) ABSTRACT

A method and a system for three-phase detection of a three-phase electric device are provided. The system includes a testing circuit and a comparison module. The testing circuit generates two reference voltages by using the three phase voltages of the three-phase electric device. The two reference voltages are the first and second phase voltages with reference to the third phase voltage, respectively. Three-phase detection is performed by comparing the two reference voltages for a determined number of times. After testing is completed, the testing circuit is switched off by the comparison module, to save power.

16 Claims, 6 Drawing Sheets

METHOD AND SYSTEM FOR LOW-POWER THREE-PHASE DETECTION

FIELD OF THE INVENTION

The invention relates generally to the field of three-phase Alternating Current (A.C.) power sources. More specifically, the invention relates to a method and system for low-power detection of the three phases of an A.C. power source.

BACKGROUND OF THE INVENTION

Three-phase A.C. power sources are commonly used as power sources for a variety of commercial and household electrical systems. For example, a three-phase A.C. power source can be used as a power source for electric motors, air conditioners, boilers, electrical lightening systems etc.

A typical three-phase A.C. power source generates three alternating phase voltages of the same frequency. The three alternating phase voltages can be represented by sinusoidal waveforms of the same amplitudes, but with a phase difference of 120 degrees between each other. The three sinusoidal waveforms follow a definite sequence, which repeats itself periodically. This period is based on the frequency of the A.C. power source.

The phase difference between the sinusoidal waveforms is critical, since the correct phase difference between the waveforms indicates that the A.C. power source is functioning properly. However, it is possible that the phase difference between any two phase voltages of the three-phase A.C. power source deviates from its correct value, i.e., 120 degrees. The deviation from 120 degrees can occur due to phase loss or phase reversal in the AC power source. As a result, the A.C. power source may not function properly and may adversely affect the load connected to it. In such an event, the load may overheat and get damaged. To prevent damage to the load due to the improper functioning of the A.C. power source, many conventional techniques have been used to monitor the phase differences between each of the individual phase voltages of the A.C. power source.

One such conventional technique uses a three-phase detector to monitor the waveforms of each of the three phase voltages. The three-phase detector uses three opto-isolators to monitor waveforms. An opto-isolator is a device that transfers signals from its input to its output by using an optical path. Each of the three phase voltages is measured with reference to the earth/ground at different time intervals. Further, it is checked whether each of the phase voltages is high or low in a proper sequence and at proper times. An abnormality in the timings of the waveforms suggests that the A.C. power source is faulty. In such an event, the A.C. power source can be replaced or repaired.

However, the three-phase detector suffers from some limitations. Firstly, three separate opto-isolators are required to monitor each of the phase voltages. The use of three opto-isolators is not cost-effective. Secondly, the three-phase detector is not switched off when no phase detection is being carried out, which results in high power consumption. Therefore, there is a need for reducing the number of components in the three-phase detector. Further, there should be a provision for switching off the three-phase detector when the three-phase detection is complete.

SUMMARY

An embodiment of the present invention provides a method and a system for low-power testing of a three-phase electric device.

Another embodiment of the present invention provides a method and a system for low-power detection of the phase differences between three phase voltages of a three-phase electric device.

Another embodiment of the present invention provides a method and a system for generating and comparing two reference voltages for facilitating the testing of three-phase electric device.

Another embodiment of the present invention provides a method and a system for switching off the testing circuit when the first and second reference voltages are compared for a determined number of times.

Various embodiments of the present invention provide a three-phase detector for low-power testing of a three-phase electric device. The three-phase detector includes a testing circuit and a comparison module. The testing circuit receives three phase voltages from the three-phase electric device and generates two reference voltages from the three phase voltages. These two reference voltages are compared for a determined number of times by the comparison module to check the functioning of the three-phase electric device. When the function has been checked, the comparison module switches off the testing circuit to save power.

BRIEF DESCRIPTION OF THE DRAWINGS

The preferred embodiments of the invention will hereinafter be described in conjunction with the appended drawings, provided to illustrate and not to limit the invention, wherein like designations denote like elements, and in which.

DESCRIPTION OF EMBODIMENTS

Various embodiments of the present invention provide a method and a system for low-power testing of a three-phase electric device. The three-phase electric device generates three phase voltages that are sinusoidal signals of the same frequency and amplitude. However, these three phase voltages have a phase difference of 120 degrees between each other. This phase difference between the three phase voltages is critical, since the correct phase difference indicates that the three-phase electric device is functioning properly.

The present invention provides a three-phase detector for testing the three-phase electric device. The three-phase detector detects whether the phase difference between each of the phase voltages is 120 degrees. The three-phase detector generates two reference voltages from the three phase voltages, and tests the three-phase electric device by comparing the two reference voltages for a determined number of times. When the three-phase electric device is tested for a determined number of times, the three-phase detector is switched off to save power.

Figure 1:
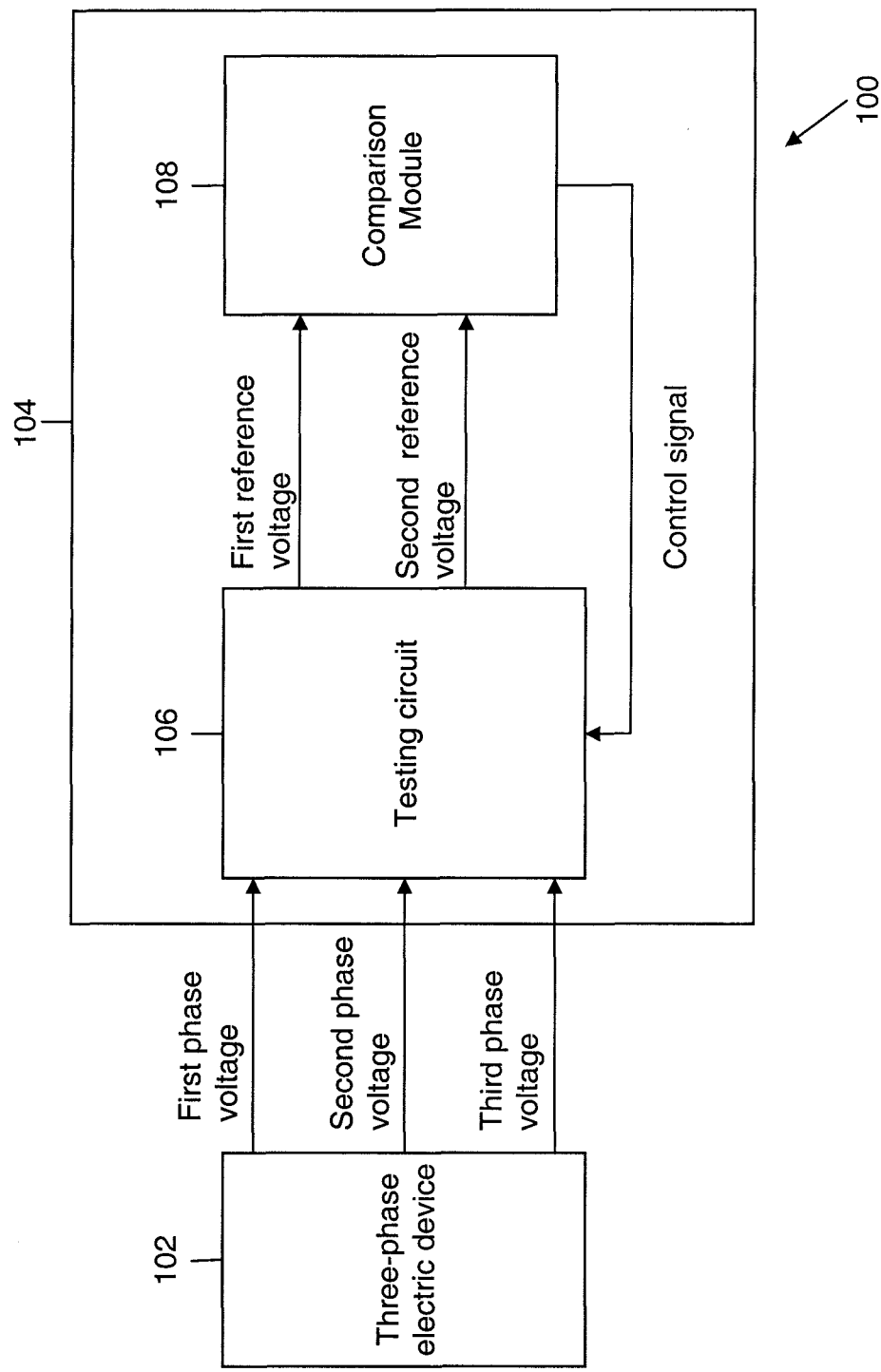
FIG. 1 illustrates an exemplary environment, wherein various embodiments of the present invention can be practiced.

FIG. 1 illustrates an environment 100 wherein various embodiments of the present invention may be practiced. Environment 100 includes a Three-phase Electric Device (TPED) 102 and a Three-phase Detector (TPD) 104. TPED 102 can be a three-phase Alternating Current (A.C.) power source that generates three phase voltages. The three-phase A.C. power source is used in various domestic and industrial applications to provide power to electrical appliances. For example, a three-phase A.C. power source can be used as a power source for electric motors, air conditioners, boilers, electrical lightening systems, etc.

The three individual phase voltages of the A.C. power source can be referred to as a first phase voltage, a second phase voltage and a third phase voltage. The three phase voltages can be represented by sinusoidal waveforms of the same frequency and amplitude. Further, there is a phase difference of 120 degrees between the sinusoidal waveforms of each of the three phase voltages. In accordance with an embodiment of the present invention, the second phase voltage lags behind the first phase voltage by 120 degrees. Further, the third phase voltage lags behind the second phase voltage by 120 degrees. The three phase voltages are fed to the three input terminals of TPD 104. TPD 104 tests TPED 102 by monitoring the waveforms of each of the three phase voltages.

TPD 104 includes a testing circuit 106 and a comparison module 108. Testing circuit 106 receives the three phase voltages from TPED 102 and is configured to generate two reference voltages from the three phase voltages. The elements and functioning of testing circuit 106 have been further explained in detail in conjunction with FIG. 2. The two reference voltages generated by testing circuit 106 are referred to as a first reference voltage and a second reference voltage. The first and the second reference voltages are fed to two input terminals of comparison module 108. Comparison module 108 can compare the first reference voltage and the second reference voltage.

Comparison module 108 generates a control signal that is fed to testing circuit 106. The control signal is used to turn off/on testing circuit 106 and can hold two values—high and low. The high value is close to 5 volts and is used to keep testing circuit 106 on. Further, the low value is close to 0 volts and is used to switch off testing circuit 106. When testing circuit 106 is on, it generates the first and second reference voltages. On the other hand, when testing circuit 106 is switched off, it does not generate the first and second reference voltages.

Each comparison of the first and the second reference voltages can be referred to as a voltage test. Each voltage test can result in success, failure or an indefinite output. The success of a voltage test implies that TPED 102 is functioning properly. Further, the failure of a voltage test implies that TPED 102 is functioning improperly. In accordance with an embodiment of the present invention the indefinite output of a voltage test can occur when the values of the first and second reference voltages are not stable and fluctuate at the time of the comparison. In such an event, nothing definite can be said about the functioning of TPED 102.

In accordance with an embodiment of the present invention, comparison module 108 compares the first and the second reference voltages for a determined number of times, denoted by N, to verify the functioning of TPED 102. The test performed by TPD 104 is complete when the N voltages tests are performed. N is a variable numeric value that is determined based on values of each of a pass flag, a fail flag, a pass threshold, a fail threshold and a maximum threshold. Various possible values of N determined on the basis of the variables mentioned above have been explained further in conjunction with FIG. 4. During the testing of TPED 102, comparison module 108 maintains the value of the control signal as high to keep testing circuit 106 on. When testing is complete, comparison module 108 switches the value of the control signal from high to low. The low value of the control signal results in testing circuit 106 being switched off.

Figure 2:
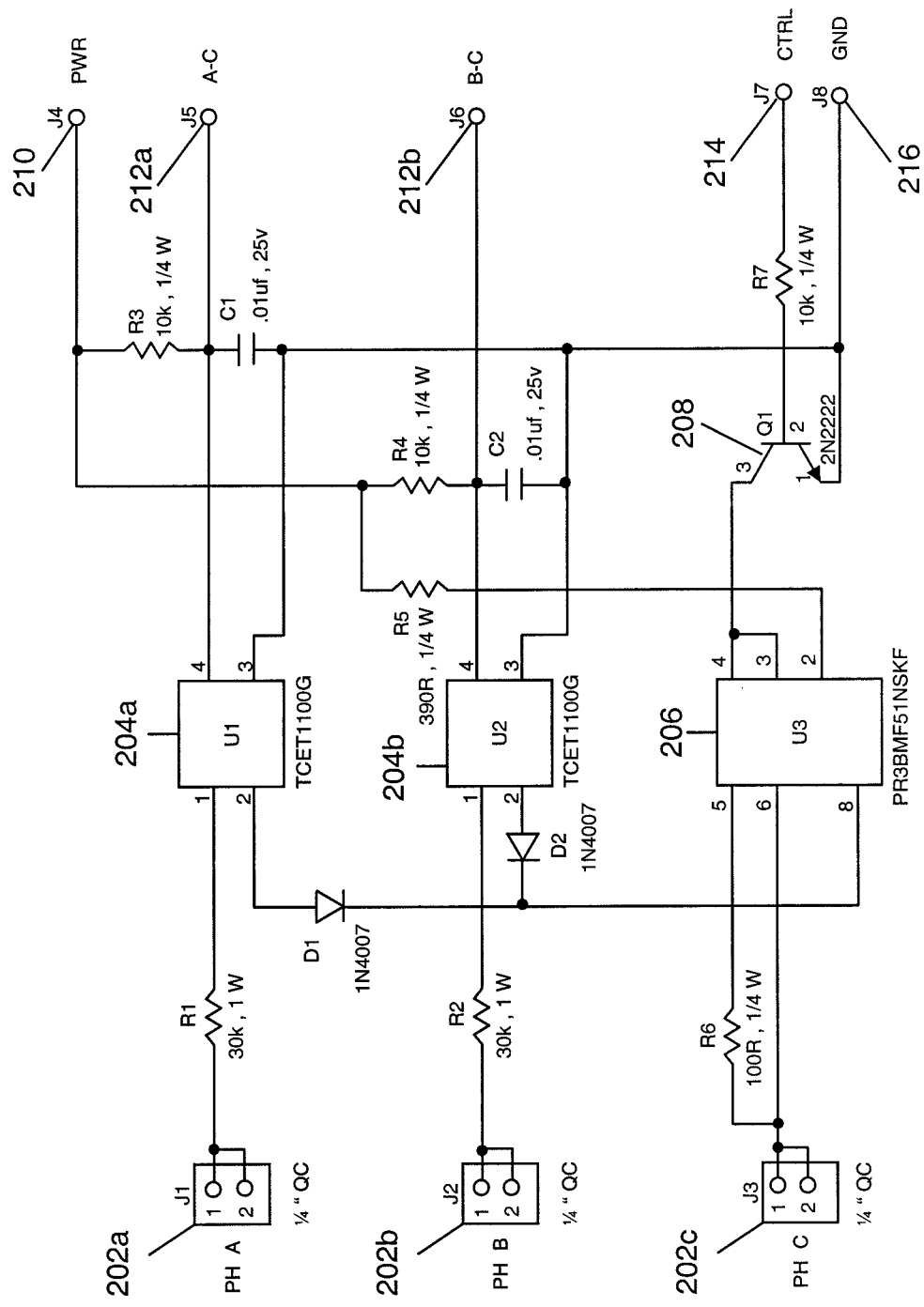
FIG. 2 illustrates a testing circuit for testing the three-phase electric device, in accordance with various embodiments of the present invention.

FIG. 2 illustrates various elements of testing circuit 106 in accordance with various embodiments of the present invention. Testing circuit 106 includes a first input terminal 202a, a second input terminal 202b, and a third input terminal 202c. Testing circuit 106 receives the three phase voltages generated by TPED 102 at its three input terminals 202a-c. The first, second and third phase voltages are received at first, second and third input terminals 202a-c, respectively.

Testing circuit 106 also includes a first electronic component 204a, a second electronic component 204b, a third electronic component 206, a Bipolar Junction Transistor (BJT) 208, and one or more resistors, capacitors and diodes. These components facilitate the generation of the first and second reference voltages from the three phase voltages. Further, various resistors, capacitors and diodes have not been assigned reference numerals in FIG. 2, to clarify the drawing and the explanation of the invention.

Testing circuit 106 also includes a voltage supply terminal (PWR) 210, a first output terminal (A-C) 212a, a second output terminal (B-C) 212b, a control terminal (CTRL) 214, and a ground terminal (GND) 216. Voltage supply terminal 210 provides the standard supply voltage that is equal to 5 volts to testing circuit 106. Further, ground terminal 216 is used to earth testing circuit 106. Furthermore, control terminal 214 provides the control signal generated by comparison module 108 to testing circuit 106. Moreover, the first and second reference voltages are generated at the first and second output terminals 212a-b, respectively.

In accordance with an embodiment of the present invention, first electronic component 204a is configured to receive the first phase voltage from TPED 102 via first input terminal 202a, and generate the first reference voltage from the first and third phase voltages. Further, second electronic component 204b is configured to receive the second phase voltage from TPED 102 via second input terminal 202b, and generate the second reference voltage from the second and the third phase voltages. Furthermore, third electronic component 206 is configured to receive the third phase voltage from TPED 102 via third input terminal 202c, and provide the third phase voltage to first and second electronic components 204a-b for the generation of the first and second reference voltages. Third electronic component 206 provides the third phase voltage to first and second electronic components 204a-b on the basis of the control signal generated by comparison module 108.

In accordance with an embodiment of the present invention, first and second electronic components 204a-b are opto-isolators (TCET1100G). Hereinafter, first electronic component 204a is referred to as a first opto-isolator and second electronic component 204b is referred to as a second opto-isolator. The first and second opto-isolators are electronic devices that can transfer signals from input terminals (pins 1 and 2) to output terminals (pins 3 and 4) by using an optical transmission path. As illustrated in FIG. 2, pins 3 of the first and second opto-isolators are connected to ground terminal 216. Further, pins 4 of the first and second opto-isolators are connected to first and second output terminals 212a-b. Pins 4 are also connected to voltage supply terminal 210 through pull up resistors R3 (10 k, ¼ W) and R4 (10 k, ¼ W), respectively. Furthermore, a capacitor C1 (0.01 uf, 25 v) is connected between pins 3 and 4 of the first opto-isolator, and a capacitor C2 (0.01 uf, 25 v) is connected between pins 3 and 4 of the second opto-isolator. The capacitors C1 and C2 prevent noise signals from reaching pins 4 of the first and second opto-isolators. Noise signals can be present in testing circuit 106 because of the electrical noise.

Further, the input terminals (pins 1 and 2) of the first and the second opto-isolators are connected internally through Light Emitting Diodes (LEDs). In an opto-isolator, the current flows between the input terminals (pins 1 and 2) through an LED. In the absence of the current flow through the LED, the voltage at the output terminal (pin 4) of the opto-isolator is at a Transistor Transistor Logic (TTL) high, i.e., close to 5 volts. On the other hand, when there is a current flow through the pins 1 and 2, the voltage at pin 4 reaches a TTL low, i.e., close to 0 volts. Therefore, depending on the current flow through the pins 1 and 2 of the opto-isolator, a binary voltage signal is generated at pin 4 of the opto-isolator. The binary voltage signal holds either a first value or a second value. The first value corresponds to TTL high, whereas the second value corresponds to TTL low.

As illustrated in FIG. 2, the first and second phase voltages at first and second input terminals 202a-b are fed to pins 1 of the first and second opto-isolators through resistors R1 (30 k, 1 W) and R2 (30 k, 1 W), respectively. Further, the first and second opto-isolators use the third phase voltage for the generation of the first and second reference voltages. The third phase voltage is provided by third electronic component 206, which is connected to the first and second opto-isolators. The first and second reference voltages are generated as binary voltage signals at first and second output terminals 212a-b, respectively and they hold values selected from the group consisting of: the first value and the second value.

In accordance with an embodiment of the present invention, third electronic component 206 is a solid state relay (PR3BMF51NSKF), and is hereinafter referred to as a Solid State Relay (SSR). Pin 2 of the SSR is connected to voltage supply terminal 210 through resistor R5 (390 R, ¼ W). The SSR receives the third phase voltage from third input terminal 202c at pins 5 and 6 through resistor R6 (100 R, ¼ W). The third phase voltage is relayed from pins 5 and 6 to pin 8 of the SSR on the basis of the control signal at control terminal 214. Further, pin 8 is connected to pin 2 of the first and the second opto-isolators through diodes D1 (1N4007) and D2 (1N4007), respectively. Therefore, the first and second opto-isolators receive the third phase voltage at corresponding pins 2 from pin 8 of the SSR.

In accordance with an embodiment of the present invention, generation of the first reference voltage is described with reference to the first opto-isolator and the SSR. The first opto-isolator receives the first phase voltage at pin 1 and the third phase voltage at pin 2 through the diode D1. When the first phase voltage is less than the third phase voltage, the diode D1 is reverse-biased. Hence, no current flows through D1, resulting in a zero current through the LED of the first opto-isolator. As a result, the first reference voltage at pin 4 holds the first value, which corresponds to TTL high. On the other hand, when the first phase voltage is greater than the third phase voltage, the diode D1 is forward-biased. Hence, current flows through D1, thereby causing current a flow through the LED of the first opto-isolator. As a result, the first reference voltage at pin 4 holds the second value, which corresponds to TTL low. In this manner, the first reference voltage is generated as a binary voltage signal at the output terminal (pin 4) of the first opto-isolator. The first reference voltage is generated on the basis of the difference between the first and third phase voltages, and can be termed as a first phase voltage referenced to the third phase voltage. The first reference voltage generated at pin number 4 is also available at first output terminal 212a of testing circuit 106, since first output terminal 212a is connected to pin 4 of the first opto-isolator.

The method for the generation of the second reference voltage by the second opto-isolator is similar to the method for the generation of the first reference voltage by the first opto-isolator. The second reference voltage is generated by using the second phase voltage, the third phase voltage and diode D2. The second reference voltage is generated at second output terminal 212b of testing circuit 106. Further, the second reference voltage is generated on the basis of the difference between the second and third reference voltages and can be termed as a second phase voltage referenced to the third phase voltage.

Now referring to the SSR, the relay of the third phase voltage from pins 5 and 6 to pin 8 on the basis of the control signal is described. In accordance with an embodiment of the present invention, the third phase voltage is relayed to pin 8 on the basis of the voltage signal at pins 3 and 4 of the SSR. Pins 3 and 4 are connected to the collector (pin 3) of Bipolar Junction Transistor (BJT) 208. BJT 208 is a NPN type transistor. The voltage signal at pins 3 and 4 is controlled by the control signal through the use of BJT 208. Further, the emitter (pin 1) of BJT 208 is connected to ground terminal 216, and the base (pin 2) is connected to control terminal 214 through resistor R7 (10 k, ¼ W). The control signal is applied at control terminal 214. When the value of the control signal is high, i.e., close to 5 volts, BJT 208 is in the active mode. In the active mode, current flows from the collector (pin 3) to emitter (pin 1) of BJT 208, causing a current flow through the pins 3 and 4 of the SSR. The current flow through the pins 3 and 4 of the SSR enables the relay of the third phase voltage from pins 5 and 6 to pin 8 of the SSR. Therefore, when the value of the control signal is high, the third phase voltage is available to the first and second opto-isolators for the generation of the first and second reference voltages. As mentioned earlier in the explanation of FIG. 1, comparison module 108 maintains the value of the control signal as high to facilitate the testing of TPED 102 by testing circuit 106.

On the other hand, when the value of the control signal is low, i.e., close to 0 volts, BJT 208 is in the cut-off mode. In the cut-off mode, there is no current flow from the collector (pin 3) to the emitter (pin 1) of BJT 208, which results in there being no current flow through pins 3 and 4 of the SSR. Therefore, the third phase voltage is not relayed to pin 8 of the SSR, and the first and second reference voltages are not generated. In other words, testing circuit 106 is switched off and no current flows through testing circuit 106. Switching off testing circuit 106 facilitates power reduction in the overall process of testing TPED 102, which results in low-power testing of TPED 102.

In accordance with an embodiment of the present invention, the first and second reference voltages are periodic with a period that is the same as the period of the first, second and third phase voltages. For example, the frequency of the first and second reference voltages is 60 Hz; therefore, the time period of each of the first and second reference voltages is 16.67 milliseconds (ms). As mentioned above, the second phase voltage lags behind the first phase voltage by 120 degrees, and the third phase voltage lags behind the second phase voltage by 120 degrees. Therefore, the first and second reference voltages have a phase difference of 60 degrees. As a result, the second reference voltage lags behind the first reference voltage in time that is equal to 2.77 ms. approximately. The time lag of 2.77 ms corresponds to the phase difference of 60 degrees between the first and second reference voltages.

Figure 3:
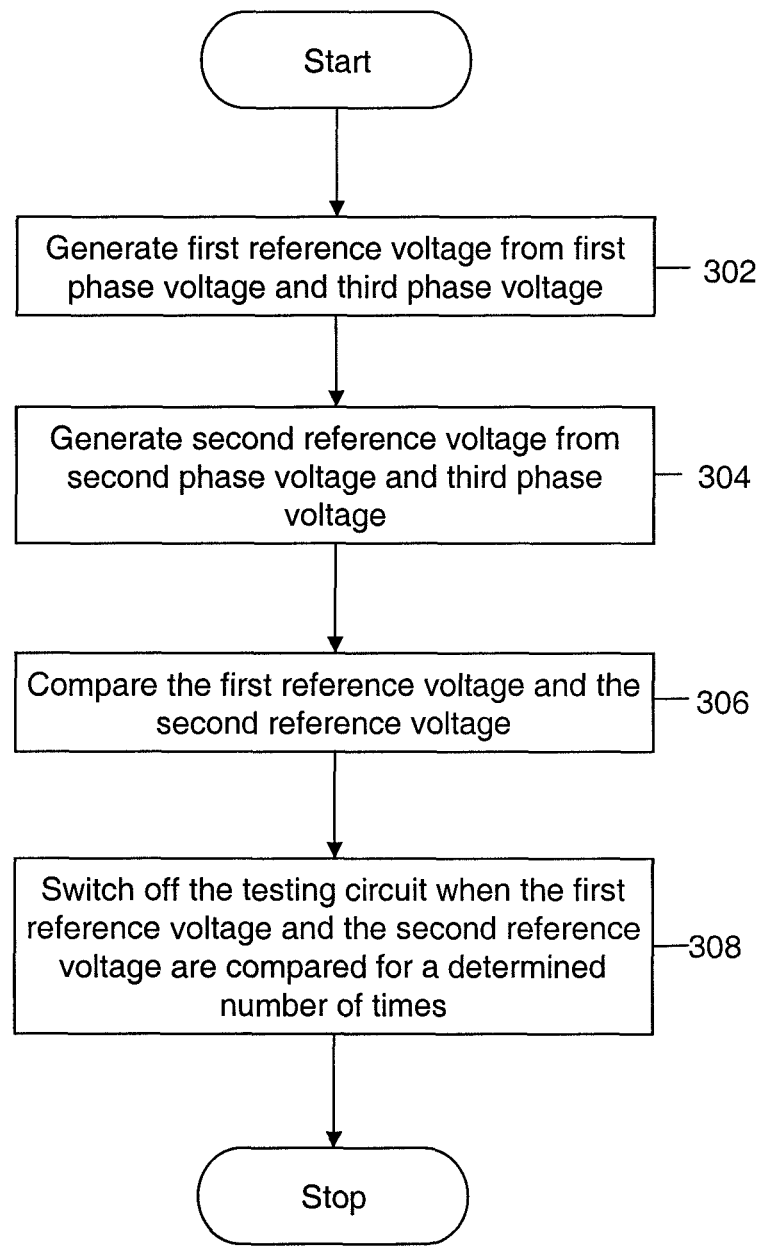
FIG. 3 is a flowchart illustrating a method for low-power testing of the three-phase electric device, in accordance with various embodiments of the present invention.

FIG. 3 is a flowchart illustrating a method for low-power testing of TPED 102, in accordance with various embodiments of the present invention. At step 302, the first opto-isolator generates the first reference voltage at first output terminal 212a from the first and third phase voltages. Further, at step 304, the second opto-isolator generates the second reference voltage at second output terminal 212b from the second and third phase voltages. The first and second reference voltages are generated by the first and second opto-isolators according to the method described earlier in conjunction with FIG. 2.

The first and second references voltages generated at steps 302 and 304, respectively are compared with each other at step 306 by comparison module 108. This is done to test the functioning of TPED 102. When comparison module 108 performs the comparison for the determined number of times N, testing circuit 106 is switched off at step 308. Testing of TPED 102 is said to be complete when testing circuit 106 is switched off. The method for the determination of N is explained in conjunction with FIG. 4.

Figure 4A:
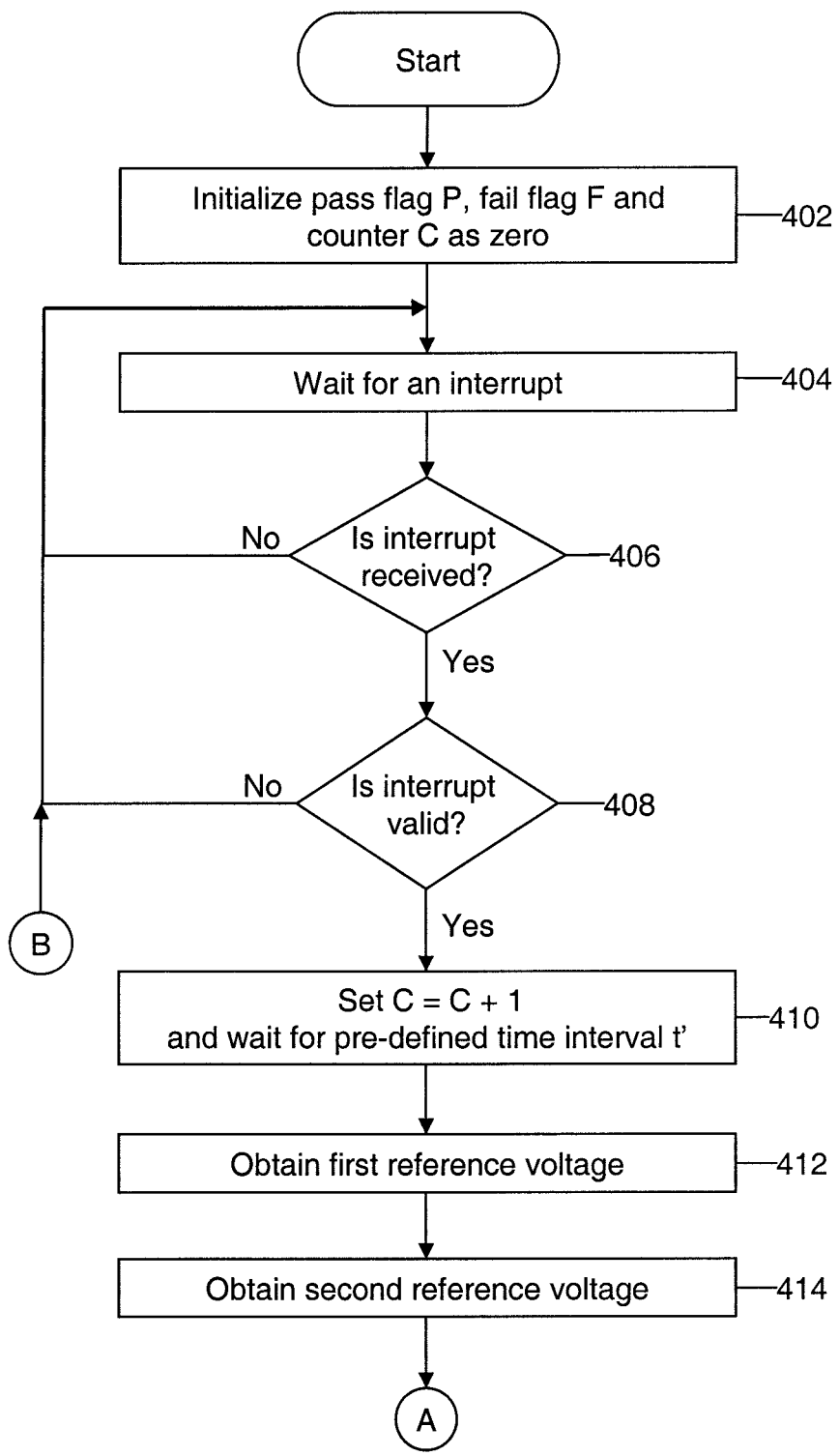
FIG. 4 is a flowchart illustrating in detail a method for low-power testing of the three-phase electric device, in accordance with various embodiments of the present invention.
Figure 4B:
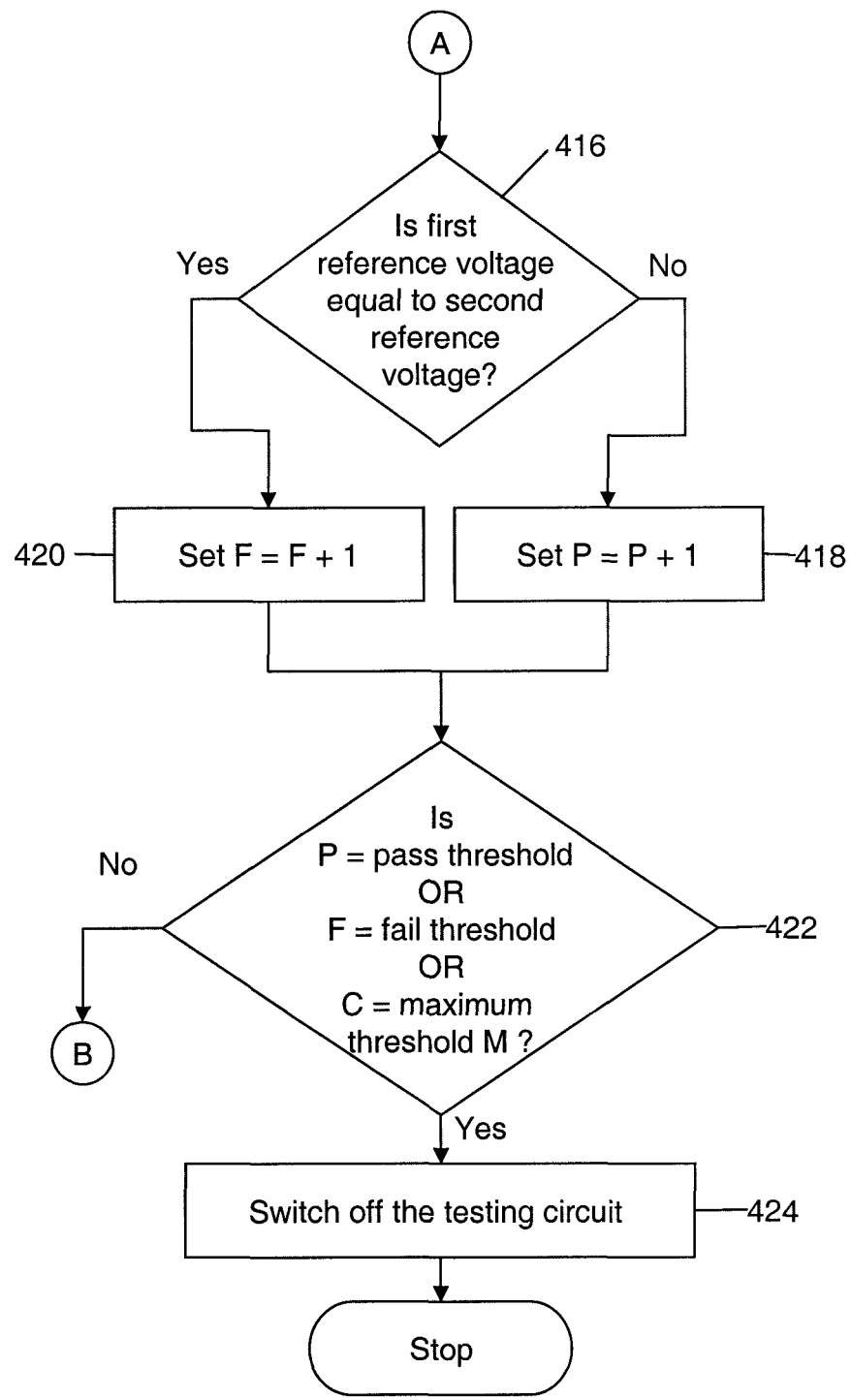

FIG. 4 is a flowchart illustrating in detail a method for low-power testing of TPED 102, in accordance with various embodiments of the present invention. As mentioned earlier, a voltage test is performed by comparing the first and second reference voltages. The voltage test facilitates testing of the functioning of TPED 102. At step 402, comparison module 108 initializes the values of the pass flag P, the fail flag F and a counter C as zero. The pass flag P, the fail flag F and the counter C are variable numeric values. The counter C indicates the total number of voltage tests that have been performed to test the TPED 102. Further, the pass flag P indicates the number of voltage tests that resulted in success and the fail flag F indicates the number of voltage tests that resulted in failure. The success of a voltage test implies that TPED 102 is functioning properly, whereas the failure of the voltage test implies that TPED 102 is not functioning properly. Therefore, when a voltage test succeeds, the pass flag is incremented by one. On the other hand, when the voltage test fails, the fail flag is incremented by one.

However, testing of TPED 102 cannot be checked by a single voltage test. Therefore, more than one voltage test is carried out to test the functioning of TPED 102. Proper functioning of TPED 102 can be guaranteed when the number of voltage tests that succeed reaches the pass threshold. Therefore, as soon as the pass flag P reaches the pass threshold, it can be said that first and second reference voltages have the correct phase difference between them, and TPED 102 is functioning properly. On the other hand, when the fail flag F reaches the fail threshold, it can be said that the first and second reference voltages have an incorrect phase difference between them and TPED 102 is not functioning properly. Further, whenever a voltage test is performed, counter C is incremented by one, irrespective of the outcome of the voltage test. In accordance with an embodiment of the present invention, the maximum value of counter C is the maximum threshold, denoted by M. This implies that the maximum number of voltage tests that can be performed is equal to M.

After initializing the pass flag P, the fail flag F and the counter C, comparison module 108 waits for an interrupt at step 404. The interrupt is received when the value of the first reference voltage changes. For example, the interrupt is received at the rising and falling edges of the first reference voltage. The rising edge is generated when the value of the first reference voltage switches from low to high. Further, the falling edge is generated when the value of the first reference voltage switches from high to low. At step 406, comparison module 108 checks whether an interrupt has been received. If the interrupt has not been received, comparison module 108 again waits for the interrupt at step 404.

In an ideal case, an interrupt is received at the rising and falling edges of the first reference voltage. Therefore, interrupts should be received regularly at a time interval that is equal to half of the period of the first reference voltage. However, it may be possible that the false interrupt is generated due to the electrical noise in testing circuit 106. Therefore, the validity of the interrupt is checked at step 408. When the interrupt is invalid, comparison module 108 waits for the next interrupt at step 404, and performs a voltage test only when a valid interrupt is received.

When a valid interrupt is received, the counter C is incremented by one at step 410. Further, at step 410, comparison module 108 waits for a pre-defined time, denoted by t', before comparing the first and second reference voltages. Comparison module 108 waits for time t' to allow the first reference voltage to stabilize after the interrupt. In accordance with an embodiment of the present invention, the value of t' is 0.5 ms. After waiting for time t', the first and second reference voltages are obtained at steps 412 and 414, respectively. The first and second reference voltages are obtained from testing circuit 106. After obtaining the first and second reference voltages, a voltage test is performed at step 416, and it is checked whether the first reference voltage is equal to the second reference voltage. When the first and second reference voltages hold opposite values after time t' of receiving the interrupt, the voltage test succeeds and the pass flag P is incremented by one at step 418. On the other hand, when the first and second reference voltages hold equal values, the voltage test fails and the fail flag F is incremented by one at step 420.

At step 422, a set of conditions is checked to determine whether more voltage tests are required to check the functioning of TPED 102. The testing process performed to check the functioning of TPED 102 can be terminated in three cases. In the first case, the testing process is terminated when the value of the pass flag P reaches the pass threshold and the value of the counter C is less than or equal to M. The pass threshold determines the minimum number voltage of tests that must succeed to guarantee proper functioning of TPED 102. In accordance with an embodiment of the present invention, the value of the pass threshold is 5. Therefore, when the pass flag P reaches the pass threshold, this implies that TPED 102 is functioning properly and no more voltage tests are required. Further, in this case, the value of N is equal to the value of the counter C at the termination of the testing process. In other words, the value of N is equal to the sum of the pass threshold and the value of the fail flag F at the termination of the testing process.

In the second case, the testing process is terminated when the value of the fail flag F reaches the fail threshold and the value of the counter C is less than or equal to M. The fail threshold determines the minimum number of voltage tests that must fail to guarantee improper functioning of TPED 102. In accordance with an embodiment of the present invention, the value of the fail threshold is 5. Therefore, when the fail flag F reaches the fail threshold, this implies that TPED 102 is not functioning properly and no more voltage tests are required. Further, in this case, the value of N is equal to the current value of counter C. In other words, the value of N is equal to the sum of the fail threshold and the value of the pass flag P at the termination of the testing process.

A third case can occur when the value of the pass flag F does not reach the pass threshold and the value of the fail flag F does not reach the fail threshold, but the value of the counter C reaches the maximum threshold M. The maximum threshold is the maximum number of voltage tests that can be performed to test TPED 102. This case occurs when the functioning of TPED 102 cannot be verified till M voltage tests. The testing process is terminated after M voltage tests. In this case, the value of N is equal to the maximum threshold M, and testing circuit 106 is switched off without determining the proper/improper functioning of TPED 102.

To determine which of the three cases mentioned above has occurred, the set of conditions includes checking three conditions at step 422. The first condition checks whether the value of the pass flag P is equal to the pass threshold. The second condition checks whether the value of the fail flag F is equal to the fail threshold. The third condition checks whether the value of the counter C is equal to the maximum threshold M. If at least one of the three conditions mentioned above is true, comparison module 108 generates a low value of the control signal. The low value of the control signal switches off testing circuit 106 at step 424 and testing of TPED 102 is complete. On the other hand, if none of the three conditions mentioned above is true, comparison module 108 waits for the next interrupt at step 404 to perform the next voltage test. Steps 404-422 are performed reiteratively until at least one of the three conditions holds true.

Figure 5:
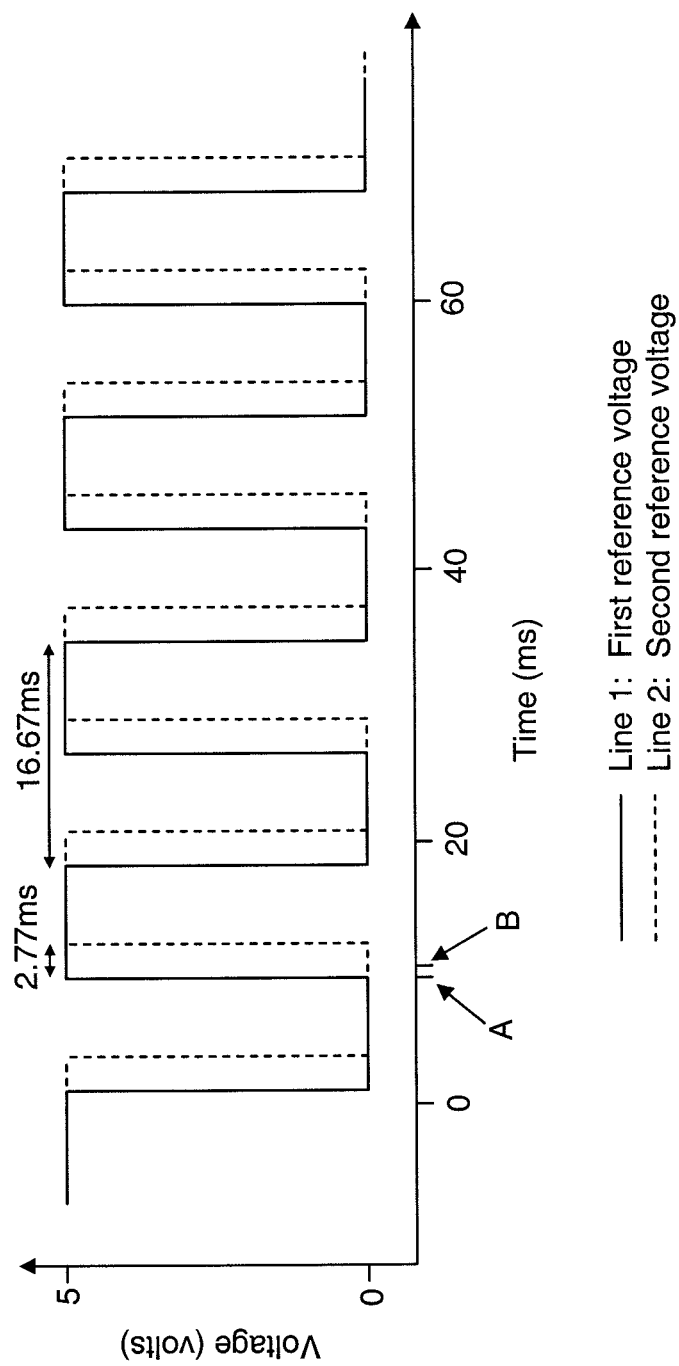
FIG. 5 shows the timing waveforms of the first and second reference voltages in accordance with various embodiments of the present invention.

FIG. 5 shows the waveforms of the first and second reference voltages in the case of proper functioning of TPED 102 in accordance with various embodiments of the present invention. The first and second reference voltages are represented by lines 1 and 2, respectively. Line 2 is a dashed line and is used to distinguish the second reference voltage from the first reference voltage. As mentioned above, each of the first and second reference voltages is a binary voltage signal that holds either a high value or a low value. The high value is 5 volts and the low value is 0 volts. The frequency of the first and second reference voltages is 60 Hz. Therefore, the time period of each waveform is 16.67 ms, as illustrated in FIG. 5. Further, the phase difference between the first and the second reference voltages is 60 degrees. Therefore, the second reference voltage lags behind the first reference voltage by approximately 2.77 ms, as illustrated in FIG. 5.

As mentioned above, the interrupts are generated at the rising and falling edges of the first reference voltage. As shown in FIG. 5, an interrupt is received at the rising edge of the first reference voltage, for example at time instant A. After receiving the interrupt at time instant A, comparison module 108 waits for time t' till time instant B. The time difference t' between time instants A and B, as shown in FIG. 5 is 0.5 ms. As shown in FIG. 5, time difference t' is small as compared to the time lag between the first and second reference voltages. After waiting for time t', comparison module 108 performs a voltage test by comparing the first and second reference voltages at time instant B. It can be observed that at time instant B, the first and second reference voltages hold opposite values, i.e., 5 and 0 volts, respectively. As a result, the voltage test succeeds. During the proper functioning of TPED 102, the interrupts are generated at regular time intervals. Therefore, in this case, all the voltage tests that are performed result in success, and the proper functioning of TPED 102 is detected. Further, the determined number of times N and the value of counter C in this case is equal to the pass threshold.

In accordance with various embodiments of the present invention, the three-phase detector provided requires low power for testing the three-phase electric device.

In accordance with various embodiments of the present invention, the three-phase detector provided switches off the testing circuit after the determined number of times.

In accordance with various embodiments of the present invention, the three-phase detector provided uses a reduced number of components for testing the three-phase electric device.

While various embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. A method for low-power testing of a three-phase electric device using a testing circuit, the three-phase electric device generating three phase voltages, each of the three phase voltages being a sinusoidal voltage signal of same frequency and amplitude, the method comprising the steps of:
   generating a first reference voltage from a first phase voltage and a third phase voltage;
   generating a second reference voltage from a second phase voltage and the third phase voltage;
   comparing the first reference voltage and the second reference voltage for a determined number of times;
   switching off the testing circuit after comparing the first reference voltage and the second reference voltage for the determined number of times, the switching off the testing circuit facilitating low-power testing of the three-phase electric device;
   wherein the step of comparing the first reference voltage and the second reference voltage includes determining whether the values of the first reference voltage and the second reference voltage are equal to each other; and
   wherein the step of determining whether the values of the first reference voltage and the second reference voltage are equal to each other occurs at a single reference time.

2. The method according to claim 1, wherein the each of the first reference voltage and the second reference voltage holds a value selected from the group consisting of: a first value and a second value.

3. The method according to claim 2, wherein the first reference voltage holds the first value when the first phase voltage is less than the third phase voltage.

4. The method according to claim 2, wherein the first reference voltage holds the second value when the first phase voltage is greater than the third phase voltage.

5. The method according to claim 2, wherein the second reference voltage holds the first value when the second phase voltage is less than the third phase voltage.

6. The method according to claim 2, wherein the second reference voltage holds the second value when the second phase voltage is greater than the third phase voltage.

7. The method according to claim 2, wherein the step of comparing the first reference voltage and the second reference voltage comprises:
   initializing values of a pass flag and a fail flag as zero;
   receiving an interrupt, the interrupt being received when the value of the first reference voltage changes;
   waiting for a pre-defined time interval when the interrupt is valid;
   comparing the first reference voltage and the second reference voltage after waiting for the pre-define time interval;
   incrementing value of the pass flag by one when values of the first reference voltage and the second reference voltage are different; and incrementing value of the fail flag by one when the values of the first reference voltage and the second reference voltage are equal.

8. The method according to claim 7, wherein the determined number of times is determined based on values of each of the pass flag, the fail flag, a pass threshold, a fail threshold and a maximum threshold.

9. The method according to claim 8, wherein the step of switching off the testing circuit comprises:
   switching off the testing circuit when the value of the pass flag is equal to the pass threshold;
   switching off the testing circuit when the value of the fail flag is equal to the fail threshold; and
   switching off the testing circuit when the determined number of times is equal to the maximum threshold.

10. The method according to claim 1, wherein the switching off the testing circuit occurs without determining whether the three-phase electric device is functioning properly when the determined number of times is equal to a maximum threshold.

11. A system for low-power testing of a three-phase electric device, the three-phase electric device comprising three phase voltages, each of the three phase voltages being a sinusoidal voltage signal of same frequency and amplitude, the system comprising:
   a testing circuit, the testing circuit configured to generate a first reference voltage and a second reference voltage from at least one of the three phase voltages, wherein the each of the first reference voltage and the second reference voltage holds a value selected from the group consisting of: a first value and a second value; and
   a comparison module, the comparison module configured to:
      initialize values of a pass flag and a fail flag as zero;
      receive an interrupt, the interrupt being received when the value of the first reference voltage changes;
      wait for a pre-defined time interval when the interrupt is valid;
      compare the first reference voltage and the second reference voltage after waiting for the pre-define time interval;
      increment value of the pass flag by one when the values of the first reference voltage and the second reference voltage are different;
      increment value of the fail flag by one when the values of the first reference voltage and the second reference voltage are equal; and
      switch off the testing circuit after comparing the first reference voltage and the second reference voltage for a determined number of times, the switching off the testing circuit facilitating low-power testing of the three-phase electric device.

12. The system according to claim 11, wherein the testing circuit comprises:
   a first electronic component, the first electronic component configured to:
      receive a first phase voltage from the three-phase electric device; and
      generate the first reference voltage at a first output, the first reference voltage being generated from the first phase voltage and a third phase voltage;
   a second electronic component, the second electronic component configured to:
      receive a second phase voltage from the three-phase electric device; and
      generate the second reference voltage at a second output, the second reference voltage being generated from the second phase voltage and the third phase voltage; and
   a third electronic component, the third electronic component configured to:
      receive a third phase voltage from the three-phase electric device; and
      provide the third phase voltage to the first electronic device and the second electronic device.

13. The system according to claim 11, wherein the determined number of times is determined based on values of each of the pass flag, the fail flag, a pass threshold, a fail threshold and a maximum threshold.

14. A system for low-power testing of a three-phase electric device, the three-phase electric device comprising three phase voltages, each of the three phase voltages being a sinusoidal voltage signal of same frequency and amplitude, the system comprising:
   a testing circuit, the testing circuit configured to generate a first reference voltage and a second reference voltage from at least one of the three phase voltages; and
   a comparison module, the comparison module configured to:
      compare the first reference voltage and the second reference voltage;
      switch off the testing circuit after comparing the first reference voltage and the second reference voltage for a determined number of times, the switching off the testing circuit facilitating low-power testing of the three-phase electric device;
   wherein the testing circuit comprises:
      a first electronic component, the first electronic component configured to:
         receive a first phase voltage from the three-phase electric device; and
         generate the first reference voltage at a first output, the first reference voltage being generated from the first phase voltage and a third phase voltage;
      a second electronic component, the second electronic component configured to:
         receive a second phase voltage from the three-phase electric device; and
         generate the second reference voltage at a second output, the second reference voltage being generated from the second phase voltage and the third phase voltage; and
      a third electronic component, the third electronic component configured to:
         receive a third phase voltage from the three-phase electric device; and
         provide the third phase voltage to the first electronic device and the second electronic device, wherein the third electronic component is configured to provide the third phase voltage to both the first electronic device and the second electronic device in response to a control signal being generated by the comparison module.

15. The system according to claim 14, wherein the third electronic component is a solid state relay.

16. The system according to claim 14, comprising a transistor configured to receive a control signal from the comparison module and transmit the control signal to the third electronic component.

* * * * *